United States Patent [19]

Ek et al.

[11] Patent Number: 5,759,898
[45] Date of Patent: Jun. 2, 1998

[54] PRODUCTION OF SUBSTRATE FOR TENSILELY STRAINED SEMICONDUCTOR

[75] Inventors: Bruce A. Ek, Pelham Manor; Subramanian Srikanteswara Iyer, Yorktown Heights; Philip Michael Pitner, Wappingers Falls, all of N.Y.; Adrian R. Powell, New Milford, Conn.; Manu Jamndas Tejwani, Yorktown Heights, N.Y.

[73] Assignee: International Business Machines Corporation, Armonk, N.Y.

[21] Appl. No.: 770,065

[22] Filed: Dec. 19, 1996

Related U.S. Application Data

[60] Continuation of Ser. No. 501,894, Jul. 13, 1995, abandoned, which is a division of Ser. No. 145,986, Oct. 29, 1993, Pat. No. 5,461,243.

[51] Int. Cl.$^6$ .................................................. H01L 21/201
[52] U.S. Cl. ........................... 438/291; 438/292; 117/939; 148/33.2
[58] Field of Search ........................ 437/131, 132; 117/939; 148/33.2, 33.3, 33.4, 33.5, 33.6; 257/18, 19, 190; 438/291, 292

[56] References Cited

U.S. PATENT DOCUMENTS 4,857,270  8/1989  Maruga et al. ..................... 117/939

FOREIGN PATENT DOCUMENTS 2066847  10/1992  Canada ................................. 117/939

OTHER PUBLICATIONS

Kesan et al. "Si/SiGe Heterostructures Grown on SOI Substrates by MBE for Integrated Optoelectronics," Journal Crystal Growth, vol. 111 No. 1-4 (1991) pp. 936–942.

*Primary Examiner*—Robert Kunemund
*Attorney, Agent, or Firm*—Daniel P. Morris

[57] ABSTRACT

A process and method for producing strained and defect free semiconductor layers. In a preferred embodiment, silicon on insulator may be used as a substrate for the growth of fully relaxed SiGe buffer layers. A new strain relief mechanism operates, whereby the SiGe layer relaxes without the generation of threading dislocations within the SiGe layer. This is achieved by depositing SiGe on an SOI substrate with a superficial silicon thickness. Initially the strain in the SiGe layer becomes equalized with the thin Si layer by creating tensile strain in the Si layer. Then the strain created in the thin Si layer is relaxed by plastic deformation during an anneal. Since dislocations are formed, and glide in the thin Si layer, threading dislocations are not introduced into the upper SiGe material. A strained silicon layer for heterostructures may then be formed on the SiGe material.

16 Claims, 1 Drawing Sheet

PRODUCTION OF SUBSTRATE FOR TENSILELY STRAINED SEMICONDUCTOR

This is a continuation of application Ser. No. 08/501,894, filed Jul. 13, 1995 now abandoned, which is a division of application Ser. No. 08/145,986, filed Oct. 29, 1993 now U.S. Pat. No. 5,461,243.

FIELD OF THE INVENTION

This invention relates to a semiconductor substrate structure. More particularly it relates to a pseudostructure on which a strained silicon layer may be grown for purposes of producing strained silicon based heterostructures.

BACKGROUND ART

Recently, there has been a high level of activity using strained Si-based heterostructures to achieve high mobility structures for FET applications. Traditionally, the method to implement this has been to grow strained Si layers on a relaxed SiGe buffer. In this configuration, doping the SiGe layer leads to modulation doping of the tensile strained Si channel. Over the years, continual improvements in the buffer layers have led to an increase in the channel electron mobility to >150,000 $cm^2/Vs$ at 4.2° K. However, there are several disadvantages to the growth of these thick buffer layers. First, as they are typically a micrometer to several micrometers thick, they are not easy to integrate with Si technology. Second, the defect density in these thick buffers is still high, about to $10^4$ to $10^7$ $cm^{-2}$ which is too high for realistic VLSI consideration. Thirdly, the nature of the structure precludes selective growth of the SiGe so that circuits employing devices with strained Si, unstrained Si and SiGe material are difficult to integrate. This may be necessary since the strained Si channel is not usable as a high mobility hole channel and CMOS applications will not be optimized. Finally the high residual defect density may preclude obtaining the highest mobility possible. Besides the FET applications there is interest in relaxed buffer layers for other structures such as zone folding in monolayer type superlattices or resonant tunneling diodes.

In order to produce relaxed SiGe material on a Si substrate, conventional practice has been to grow a uniform, graded, or stepped, SiGe layer to beyond the metastable critical thickness (that is the thickness beyond which dislocations form to relieve stress) and allow misfit dislocations to form, with the associated threading dislocations, through the SiGe layer. Various buffer structures have been used to try to increase the length of the misfit dislocation sections in the structures and thereby reduce the threading dislocation density.

SUMMARY OF THE INVENTION

It is a principal object of the present invention to provide a strained silicon layer for the fabrication of heterostructures.

It is another object of the present invention to provide a pseudo-substrate which includes a layer of a semiconductor having a different lattice constant than silicon which is predominantly relaxed and defect free grown on a layer of silicon.

It is yet another object of the invention to provide a method for producing such a pseudo-substrate.

It is still another object of the invention to provide a predominantly relaxed silicon-germainum layer without dislocation injection into the layer.

It is an additional object of the invention to provide a method of producing a silicon-germaninum layer on a silicon layer without dislocation injection into the silicon-germanium material.

In accordance with the invention a pseudo-substrate structure comprises a semiconductor base layer, a layer of amorphous material on the base layer, a silicon layer on the amorphous material layer, and a semiconductor of different lattice constant from the silicon layer grown pseudomorphically on the silicon layer, the structure being annealed together to form a layered structure with a surface having a lattice constant different from that of silicon. The structure may comprise a semiconductor base including a silicon layer on an insulator of different lattice constant from that of silicon. The insulator may be silicon dioxide. The grown semiconductor may include silicon and germanium. A strained layer of silicon for the fabrication of heterostructures, is formed on the grown semiconductor layer.

The method according to the present invention comprises producing a semiconductor structure by providing a semiconductor base layer, in association with a layer of amorphous material on the semiconductor base layer, and a silicon layer on the amorphous material layer, growing a semiconductor of different lattice constant from the silicon layer pseudomorphically on the silicon layer and annealing all of the layers together to form a layered structure with a surface having a lattice constant greater than that of silicon. The amorphous material may be silicon dioxide. The grown semiconductor may comprise silicon and germanium. A tensially strained semiconductor layer may be grown on the surface of said semiconductor layer. The tensilely strained semiconductor layer may be silicon.

DESCRIPTION OF THE PREFERRED EMBODIMENT

Figure 1:
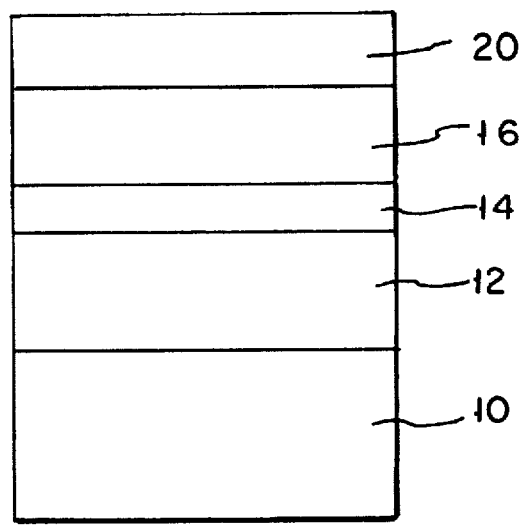
FIG. 1 illustrates the structure of the present invention.

In accordance with the present invention, the production of a cubic (i.e., relaxed) SiGe layer on a Si substrate is performed so that it is not necessary for dislocations to be introduced into the SiGe layer in order for relaxation to take place. If a thin (50 nm) membrane of Si in free space has deposited on it an equal thickness of SiGe material, the strain in the bi-layer of Si and SiGe equalizes so that there are equal and opposite strains in the two layers (tensile in the Si and compressive in the SiGe). As the SiGe layer increases in thickness more strain is transferred from it to the Si layer as in equation:

$$Be_1^2 \cdot h_1 = Be_2^2 \cdot h_2$$

Where $B=2G(1+n)/(1-n)$, G=shear modulus, n=Poisson's ratio, e=mismatch, and h=layer thickness. Thus by producing a bi-layer with the SiGe significantly thicker than the Si layer, predominantly relaxed SiGe may be produced without the requirement for dislocation injection into the SiGe material.

In practice a thin membrane of Si is extremely difficult to produce, has virtually no mechanical strength and the bi-layer produced would curl up due to the strain present. To overcome these problems reference is made to FIG. 1. A silicon substrate 10 has formed thereon an insulating layer 12 such as silicon dioxide. However, this layer could also be formed of other oxides, nitrides, or carbides. It could also be sapphire. Layer 12 may have a thickness which varies over a rather broad range. A thin silicon layer 14 is formed thereon. Silicon layer 14 is thus supported by a material that allows slippage at the Si/support structure interface but also provides mechanical strength to the structure. Thus a pseudo-membrane of Si is provided. Using an oxide layer as the support structure provides the correct characteristics, and in addition, all of the advantages of SOI (silicon-on-insulator) structures would exist in the structures subsequently produced.

A relaxed, defect free $Si_{1-x}Ge_x$ layer 16, where $0<x<1$, is then formed on silicon layer 14.

An SOI (silicon on insulator) wafer (or in principle a silicon on sapphire wafer having a layer of silicon on a layer of sapphire) which includes substrate 10, insulating layer 12 and silicon layer 14 is used as the starting material. This wafer can be produced by any one of several techniques including SIMOX, BESOI etc. Silicon layer 14 should be very thin and may have a thickness of approximately 50 nm but depending on the application, the thickness can range between 2 nm and 500 nm. Such a thin layer can be produced through production of ultra thin SOI or oxidation of a layer 14 of an SOI wafer followed by etching of the resulting $SiO_2$ top layer. However, the thickness required for this Si layer depends upon the Ge composition to be used. For a 15% Ge layer 16 a 50 nm Si layer is acceptable. However, for a 30% Ge layer 16, the thickness of silicon layer 14 is approximately 20 nm.

On this thin silicon layer 14 of an SOI wafer SiGe is epitaxially grown by a process such as liquid phase growth, ultra high vacuum chemical vapor deposition, or any other low temperature process such as solid source molecular beam epitaxy. This can be done in at least two ways. Using a first technique, growth is accomplished at low temperatures (500° C.), to a thickness below the metastable critical thickness. The sample is then annealed at temperatures above 700° C. Due to slippage at the interface of silicon layer 14 and insulating layer 12 (or flow in the layer 12), relaxation of the SiGe layer 16 occurs. In any event, the anneal must be accomplished at a high enough temperature for such slippage or flow to occur. In order to achieve further relaxation, the deposition of further SiGe followed by a second anneal may be required.

Using a second technique the SiGe of layer 16 may be deposited at growth temperatures above 700° C. and grown to any thickness (generally approximately 300 nm or 10 times the thickness of the silicon layer 14) to provide a predominantly relaxed buffer layer.

Figure 2:
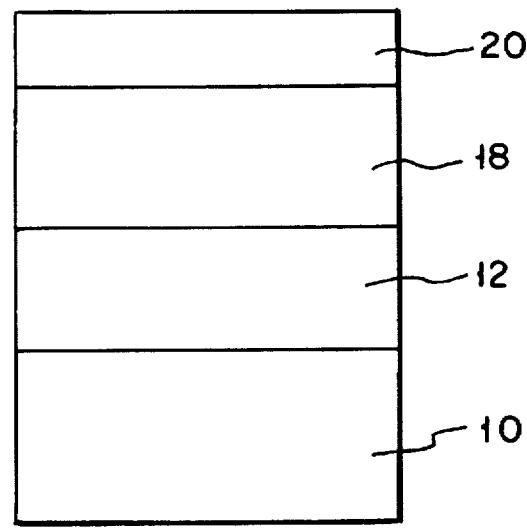
FIG. 2 illustrates the structure of FIG. 1 after a high temperature anneal.

Referring to FIG. 2, the structure of FIG. 1 may be subjected to a higher temperature annealing process. If this is done, germanium from layer 16 diffuses into layer 14 and the two layers are merged to produce a SiGe layer 18 having a substantially uniform composition but with a germanium content lower than that of layer 16 of FIG. 1. For example, if Si layer 14 is 10 nm thick while Si layer 16 of 30% Ge is 20 nm thick, after a high temperature anneal (at 1150° to 1200° C. or a lower temperature at commensurately longer times) the resulting strain-relaxed SiGe layer 18 will have 20% germanium and be approximately 30 nm thick.

Layer 16 of FIG. 1 or layer 18 of FIG. 2 serve as pseudo-substrates for the growth of a strained silicon layer 20 by further low temperature epitaxy such as molecular beam epitaxy. Layer 20 is the layer in which devices, such as the heterostructures mentioned above, are actually formed.

Thus, in accordance with the invention a high quality relaxed and defect free pseudomorphiic SiGe layer is produced on SOI material. Strained silicon layers can be grown on the SiGe layer. Relaxed SiGe structures can withstand high temperature anneals. The pseudomorphic and relaxed SiGe structures are VLSI compatible.

While the invention has been particularly shown and described with respect to a preferred embodiment thereof, it will be understood by those skilled in the art that changes in form and details may be made therein without departing from the scope and spirit of the invention. In particular other semiconductors may be substituted for Si and SiGe, and other materials may substitute for $SiO_2$.

We claim:

1. A method of making a semiconductor structure with at least two semiconductor layers with differing lattice constants forming a bilayer comprising the steps of:

providing a first structure including a first crystalline semiconductor layer of insufficient thickness to prevent curling of the bilayer due to strain between the layers thereof;

disposing said first crystalline semiconductor on a first support layer with an interface therebetween that allows slippage between said support layer and said first crystalline layer;

providing on said first crystalline layer, a second crystalline semiconductor layer to form the bilayer, said second crystalline semiconductor layer having a lattice constant different than that of said first crystalline semiconductor layer and being substantially thicker than the first crystalline semiconductor layer to transfer strain from the second crystalline semiconductor layer to the first crystalline semiconductor layer; and permitting stress relief in said first crystalline layer and said second semiconductor layer as a result of at least one of flow of said support layer and slippage at said interface.

2. The method of claim 1, wherein said first crystalline layer is comprised of a semiconductor other than that of said semiconductor layer.

3. The method of claim 1 wherein said first structure further comprises an additional layer for supporting said first support layer.

4. A method of making a semiconductor structure having at least two semiconductor layers with different lattice constants forming a bilayer comprising the steps of:

providing a semiconductor base layer;

forming a second layer of material on said semiconductor base layer;

forming a silicon layer as one of the layers of the bilayer on said second layer, said silicon layer having a thickness in and of itself insufficient to prevent curling of the bilayer due to strain without the support of the second layer;

growing a second semiconductor layer of different lattice constant from said silicon layer pesudomorphically on said silicon layer to form the bilayer, said second semiconductor layer being thinner than the metasable critical thickness but substantially thicker than the silicon layer to transfer strain from the second semiconductor layer to the silicon layer in accordance with the equation: $Be_1^2 \cdot h = Be_1^2 \cdot h_2$ where: $B+2G(1+h)/(1-h)$; G=shear modulus; n=Poisson's modulus; e=mismatch; and h=layer thickness; and annealing of all said layers together to form a layered structure with a surface having a lattice constant other than that of silicon and providing stress relief at an interface between the second and the silicon layers.

5. A method of making a semiconductor structure having at least two semiconductor layers with different lattice constants forming a bilayer comprising the steps of:

providing a semiconductor base comprising a silicon layer as one of the layers of the bilayer which layer is insufficiently thick in and or itself to prevent curling of the bilayer;

placing the silicon layer on an insulator of different lattice constant from that of silicon to support the silicon layer;

growing a second semiconductor layer of different lattice constant from said silicon layer pseudomorphically on said silicon layer to a thickness sufficiently thicker than the silicon layer to relieve substantially all the strain from the second semiconductor layer; and annealing all of said layers together to form a layered structure with a surface having a lattice constant other than that of silicon and providing stress relief at the interface between the second layer and the silicon layer.

6. A method of making a semiconductor structure comprising having at least two semiconductor layers with different lattice constants forming a bilayer the steps of:

providing a semiconductor base comprising a silicon layer as one layer of the bilayer which silicon layer has insufficient thickness to in and of itself prevent curling of the bilayer;

placing the silicon layer on an insulator of different lattice constant from that of the silicon layer to form an interface therebetween that permits slippage; and growing a SiGe semiconductor layer of different lattice constant from said silicon layer at high temperature on said silicon layer to a thickness sufficiently thicker than the silicon layer to relieve substantially all the strain from the SiGe layer and provide stress relief at said interface to form a layered structure with a surface having a lattice constant other than that of silicon.

7. A method as in claim 4 wherein said grown semiconductor comprises $Si_{1-x}Ge_x$ where $0<x<1$.

8. A method as in one of claim 4 wherein said amorphous material is selected from the group consisting of oxides, nitrides, and carbides.

9. A method as in claim 5 or 6 wherein said insulator is sapphire.

10. A method as in one of claim 4 further comprising the step of growing a tensilely-strained semiconductor layer on said surface.

11. A method as in claim 10 wherein said tensilely-strained semiconductor is silicon.

12. The method of claim 7 wherein said silicon layer is between 2 nm and 500 nm thick.

13. The method of claim 7 wherein x is approximately 0.15 and the silicon layer is approximately 50 nm thick.

14. The method of claim 7 including the step of selecting the thickness of the silicon layer based on the percentage of Ge in the $Si_{1-x}Ge_x$ layer.

15. The method of claim 7 providing a $Si_{1-x}Ge_x$ layer which is at least twice as thick as the silicon layer.

16. The method of claim 7 wherein the annealing step is performed at a temperature sufficiently high to diffuse the germanium in the $Si_{x-1}$ layer of the bilayer to form a single $Si_{y-1}Ge_y$ layer where $x>y$.

* * * * *